(12) United States Patent
Okano

(10) Patent No.: US 8,025,069 B2
(45) Date of Patent: Sep. 27, 2011

(54) SEMICONDUCTOR WAFER TREATING APPARATUS

(75) Inventor: Ayumu Okano, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 12/954,268

(22) Filed: Nov. 24, 2010

(65) Prior Publication Data

US 2011/0061691 A1 Mar. 17, 2011

Related U.S. Application Data

(63) Continuation of application No. 11/488,063, filed on Jul. 18, 2006.

(30) Foreign Application Priority Data

Jul. 20, 2005 (JP) .................................. 2005-210381

(51) Int. Cl.
*B08B 9/00* (2006.01)

(52) U.S. Cl. ........................................ 134/137; 134/140

(58) Field of Classification Search ........................ None
See application file for complete search history.

(56) References Cited

U.S. PATENT DOCUMENTS

| 6,030,485 | A * | 2/2000 | Yamada ......................... 156/344 |
| 6,861,654 | B2 | 3/2005 | Inoue |
| 2002/0189643 | A1 | 12/2002 | Chen et al. |
| 2005/0054274 | A1 | 3/2005 | Kajiyama |
| 2005/0161599 | A1 * | 7/2005 | Yoneyama et al. ............ 250/306 |
| 2006/0094210 | A1 | 5/2006 | Kajiyama |

FOREIGN PATENT DOCUMENTS

| JP | 2005-72140 | 3/2005 |
| JP | 2005-85925 | 3/2005 |

* cited by examiner

*Primary Examiner* — Michael Barr
*Assistant Examiner* — Jason Ko
(74) *Attorney, Agent, or Firm* — Smith, Gambrell & Russell, LLP

(57) ABSTRACT

A semiconductor wafer treating apparatus comprising a housing, holding means rotatably disposed within the housing, rotating means for rotating the holding means, and cleaning means for cleaning a semiconductor wafer held on the holding means. Irradiation means for irradiating the semiconductor wafer held on the holding means with short wavelength ultraviolet radiation is further disposed in the semiconductor wafer treating apparatus.

6 Claims, 4 Drawing Sheets

Fig. 3-A
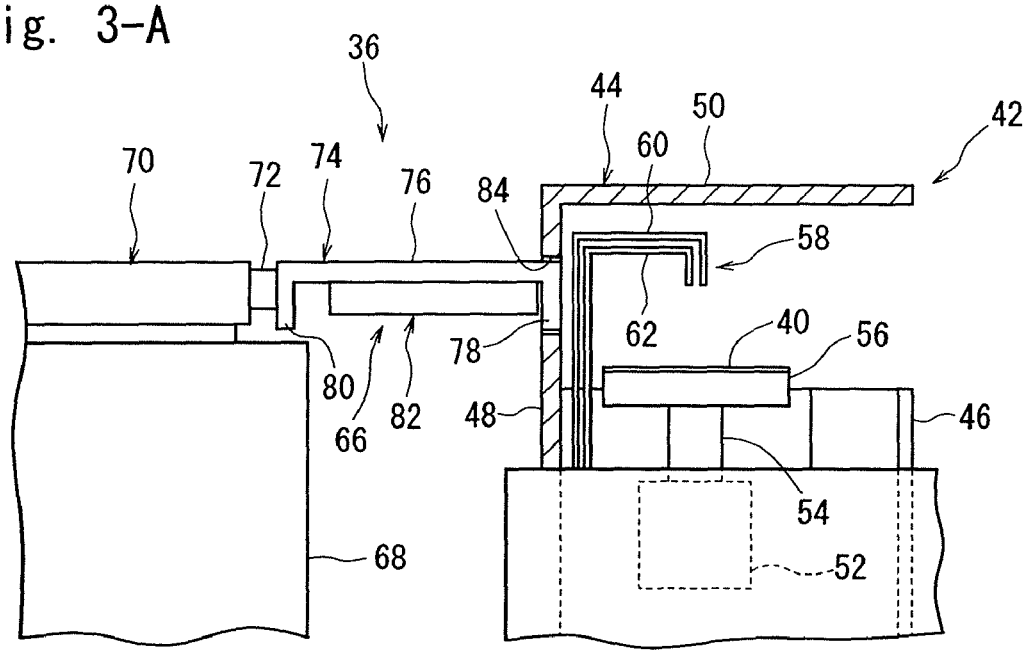
Fig. 3-B
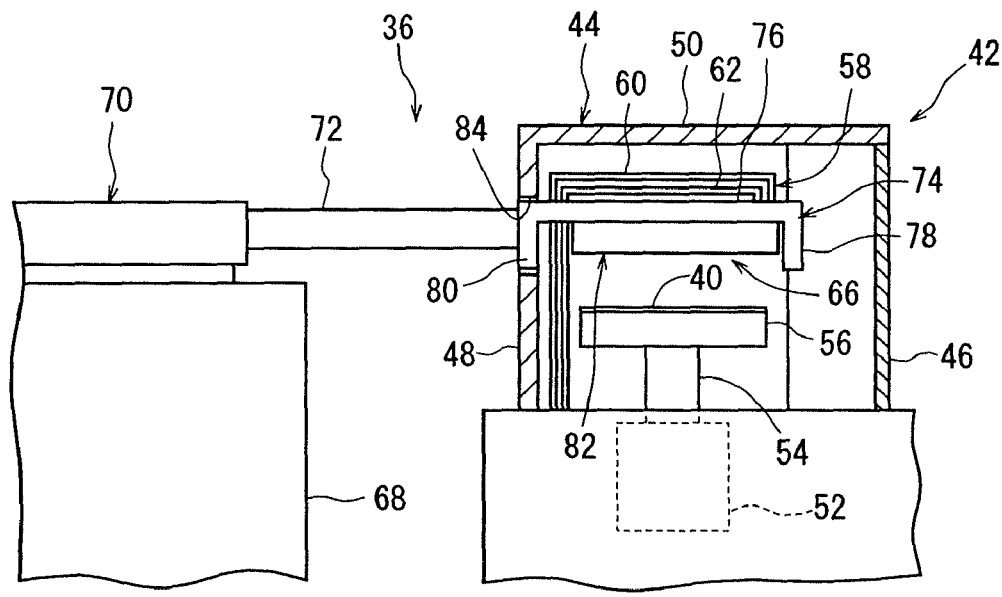

Fig. 4-A
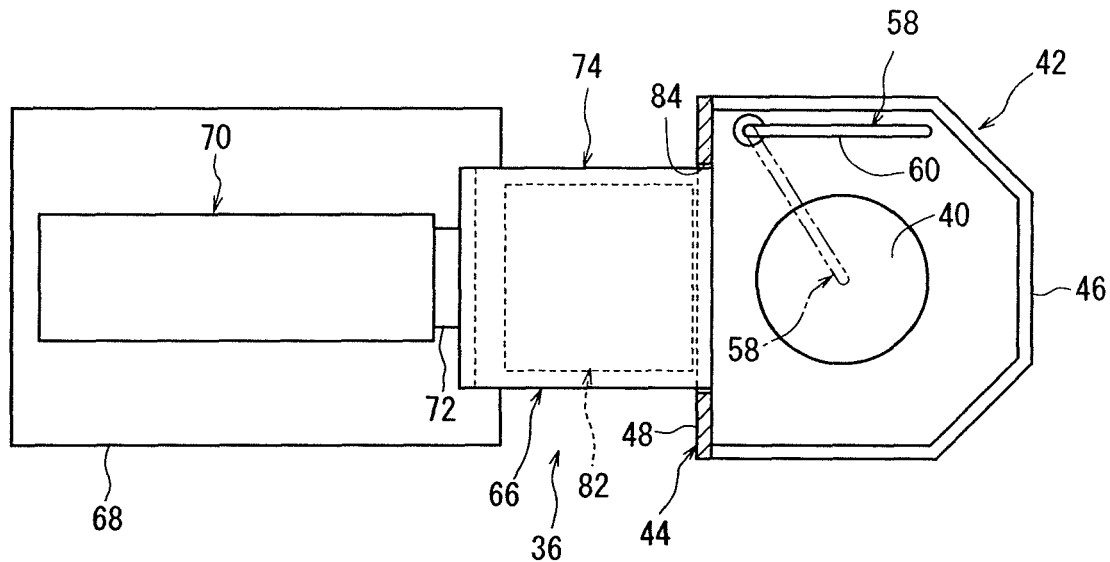
Fig. 4-B
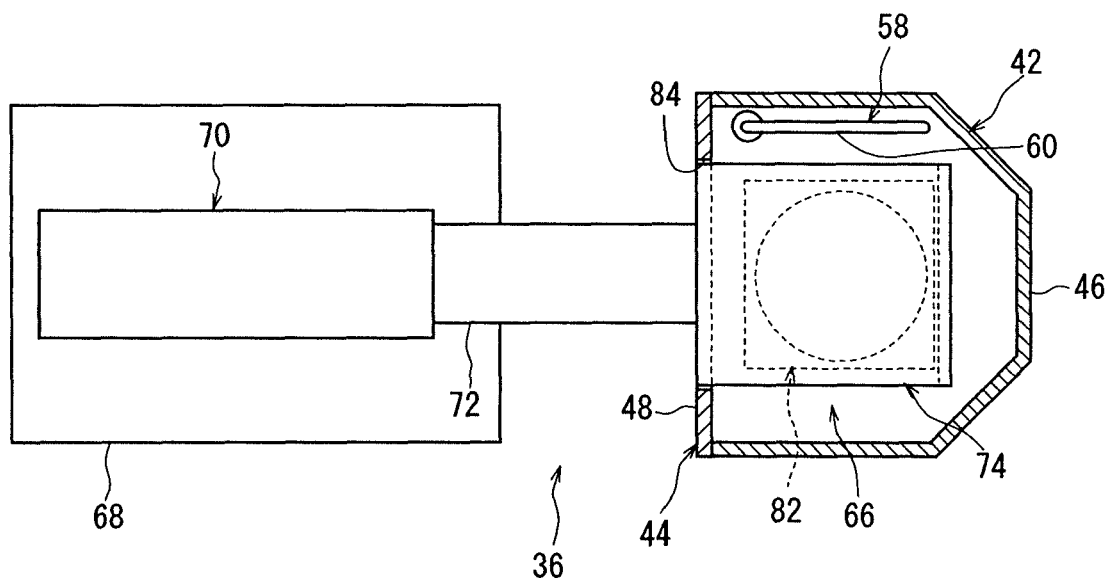

SEMICONDUCTOR WAFER TREATING APPARATUS

CROSS REFERENCE TO RELATED APPLICATION

This application is a continuation of Ser. No. 11/488,063, filed Jul. 18, 2006 and which is being incorporated in its entirety herein by reference.

FIELD OF THE INVENTION

This invention relates to a semiconductor wafer treating apparatus which can be advantageously applied in cleaning a ground back of a semiconductor wafer, and then irradiating the back with short wavelength ultraviolet radiation to form an oxide film.

DESCRIPTION OF THE PRIOR ART

In the production of a semiconductor device, many rectangular regions are defined by streets arranged in a lattice pattern on the face of a nearly disk-shaped semiconductor wafer, and a semiconductor circuit is formed in each of the rectangular regions. Then, the back of the wafer is ground to decrease the thickness of the wafer sufficiently. Then, the wafer is cut along the streets to individually separate the rectangular regions, where the semiconductor circuits have been formed, thereby obtaining semiconductor devices. When the wafer having the ground back is to be cut along the streets, it is common practice to stick a protective tape, formed from a film or sheet of synthetic resin, to the back of the wafer.

In the ordinary manufacturing process, the back of one wafer after another is ground by a grinding machine equipped with a grinding tool rotated at a high speed, and the ground back is cleaned and accommodated in a cassette. Then, the cassette accommodating a plurality of the wafers having the back ground is transported to a tape sticking machine, where the wafers are withdrawn, one after another, from the cassette, the protective tape is stuck to the back of each wafer, and the wafer is accommodated into the cassette. Then, the cassette accommodating the plurality of wafers each having the protective tape stuck to the back is transported to a cutting machine equipped with a cutting tool rotated at a high speed. In the cutting machine, the wafers are sequentially withdrawn from the cassette, and cut along the streets.

In recent times, it has found practical use to carry out grinding, sticking of the protective tape, and cutting under the in-line system in order to increase productivity. The execution of grinding, sticking of the protective tape, and cutting under the in-line system, however, has been found to pose the following problems: There may be a case where the wafer, whose back has been ground by the grinding machine and cleaned, is accommodated in the cassette, the cassette is transported to the tape sticking machine, and then the protective tape is stuck to the back of the wafer in the tape sticking machine. In this case, a considerable time elapses from the point in time when the back of the wafer is ground and cleaned until the time when the protective tape is stuck to the back of the wafer. Thus, before the protective tape is stuck to the back of the wafer, the back of the wafer is oxidized to form an oxide film. With the in-line system, on the other hand, before a sufficient time passes after the back of the water is ground and cleaned, the protective tape is stuck to the back of the wafer, so that the back of the wafer is substantially free from oxidation. If the protective tape is stuck to the back of the wafer without substantial formation of the oxide film on the back of the wafer, the following events may occur: (1) Affinity between the back of the wafer and the adhesive layer of the protective tape is so high that the release of the individual semiconductor devices from the protective tape after cutting of the wafer is difficult, thus presenting a high possibility of damage to the semiconductor device when released from the protective tape. (2) Metal ions, which enter the wafer during formation of the semiconductor circuits, move freely within the wafer, and may impair the function of the semiconductor circuit.

To solve the above-mentioned problems, Japanese Unexamined Patent Publication No. 2005-72140 discloses the introduction, into the in-line system, of an irradiation means for irradiating the ground and cleaned back of the wafer with short wavelength ultraviolet radiation to oxidize the back of the wafer before sticking the protective tape to the back of the wafer. Similarly, Japanese Unexamined Patent Publication No. 2005-85925 discloses the introduction, into the in-line system, of a hydrogen peroxide supply means for supplying the ground and cleaned back of the wafer with an aqueous solution of hydrogen peroxide to oxidize the back of the wafer before sticking the protective tape to the back of the wafer.

However, the mode disclosed in the above Japanese Unexamined Patent Publication No. 2005-72140 is not fully satisfactory, but has the problem that since the irradiation means is disposed, a considerably large space is required for the in-line system.

The mode disclosed in the above Japanese Unexamined Patent Publication No. 2005-85925, on the other hand, requires that after the aqueous solution of hydrogen peroxide is supplied to oxidize the back of the wafer, the back of the wafer be cleaned to remove the aqueous solution of hydrogen peroxide thoroughly, thus posing the problem that the time of the semiconductor device manufacturing process is excessively lengthened.

SUMMARY OF THE INVENTION

It is a principal object of the present invention, therefore, to provide a novel and improved semiconductor wafer treating apparatus which can oxidize a ground and cleaned back of a wafer under the in-line system, without excessively enlarging a required space, and without excessively extending the time of the semiconductor device manufacturing process.

The inventor diligently conducted studies, and has found that the above principal object can be attained by skillfully combining a cleaning device for cleaning the ground back of a semiconductor wafer, and an irradiation means for irradiating the back of the semiconductor wafer with short wavelength ultraviolet radiation.

According to the present invention, there is provided, as a semiconductor wafer treating apparatus for attaining the above principal object, a semiconductor wafer treating apparatus comprising a housing, a holding means rotatably disposed within the housing, a rotating means for rotating the holding means, and a cleaning means for cleaning a semiconductor wafer held on the holding means, further comprising:

an irradiation means disposed for irradiating the semiconductor wafer held on the holding means with short wavelength ultraviolet radiation.

Preferably, a part of the housing is defined by a shutter member movable between a closing position and an opening position; when the shutter member is located at the closing position, the housing is substantially closed, and when the shutter member is located at the opening position, an opening is formed in the housing; and the semiconductor wafer can be carried into and carried out of the housing through the opening. Preferably, the holding means is mounted to be rotatable about a central axis extending substantially vertically, and has a substantially horizontal holding upper surface; the cleaning means includes a cleaning fluid jetting means and a drying gas jetting means; and the cleaning fluid jetting means and the drying gas jetting means are selectively located at an operating position where a jetting end portion of each of the cleaning fluid jetting means and the drying gas jetting means opposes and stays above the holding upper surface of the holding means, and a non-operating position where the jetting end portion recedes from the holding upper surface of the holding means. Preferably, the irradiation means includes an irradiation unit having short wavelength ultraviolet radiation irradiation lamps, and the irradiation unit is selectively located at an operating position where the irradiation unit opposes and stays above the holding upper surface of the holding means within the housing, and a non-operating position where the irradiation unit is located outside the housing. Preferably, the irradiation means includes a support member mounted with the irradiation unit; the support member and the irradiation unit mounted on the support member are moved through an additional opening formed in the wall of the housing, whereby the irradiation unit is selectively located at the operating position and the non-operating position; and the support member has a first closing portion for substantially closing the additional opening when the irradiation unit is located at the operating position, and a second closing portion for substantially closing the additional opening when the irradiation unit is located at the non-operating position.

BRIEF DESCRIPTION OF THE DRAWINGS

FIGS. 3-A and 3-B are front views, partly sectional, of the semiconductor wafer treating apparatus incorporated into the system of FIG. 1.

FIGS. 4-A and 4-B are plan views, partly sectional, of the semiconductor wafer treating apparatus incorporated into the system of FIG. 1.

DETAILED DESCRIPTION OF THE PREFERRED EMBODIMENTS

Preferred embodiments of a semiconductor wafer treating apparatus according to the present invention will now be described in further detail by reference to the accompanying drawings.

Figure 1:
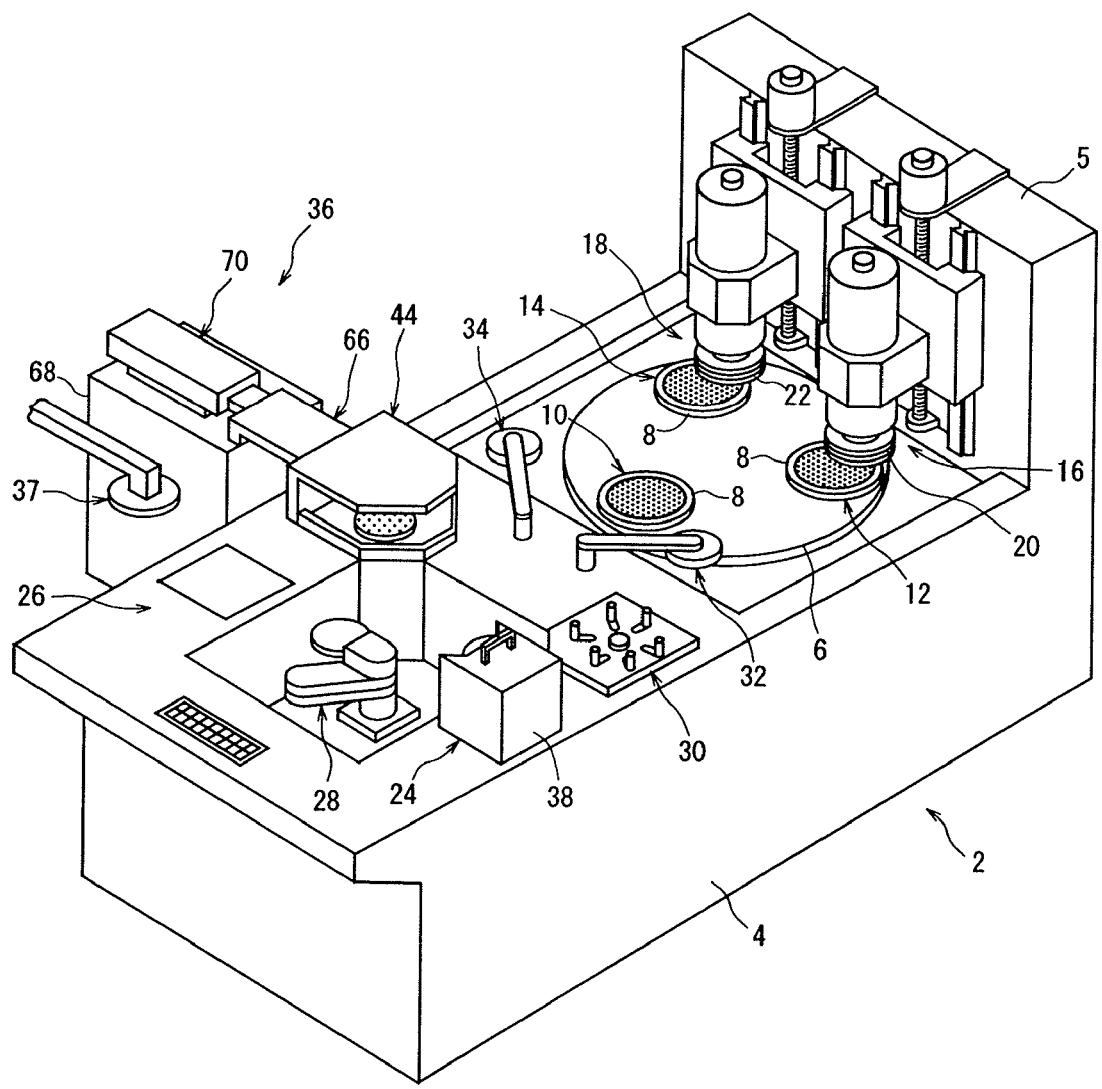
FIG. 1 is a perspective view showing a system incorporating a preferred embodiment of a semiconductor wafer treating apparatus constituted in accordance with the present invention.

FIG. 1 shows a typical example of a system for grinding, cleaning and oxidizing the back of a semiconductor wafer, the system incorporating a preferred embodiment of a semiconductor wafer treating apparatus constituted in accordance with the present invention. This system has a housing indicated entirely at the numeral 2, and the housing 2 has a rectangular parallelepipedal main portion 4 extending in an elongated manner. An upright wall 5 extending substantially vertically and upwardly is disposed in a rear end portion of the main portion 4.

A turntable 6 is disposed on the upper surface of a rear half of the main portion 4 of the housing 2. The turntable 6 is mounted to be rotatable about a central axis extending substantially vertically. A suitable electric motor (not shown) is drivingly connected to the turntable 6 to rotate the turntable 6 intermittently through an angle of 120 degrees. Three chuck means 8 are disposed on the turntable 6 with equally angled spacing in the circumferential direction. Each of the chuck means 8 is composed of a porous disk mounted to be rotatable about a central axis extending substantially vertically. A suitable electric motor (not shown) is drivingly connected to each of the chuck means 8 to rotate each of the chuck means 8 at a suitable speed. A vacuum source (not shown) is selectively brought into communication with the chuck means 8 and, as will be further mentioned later, a semiconductor wafer placed on the chuck means 8 is attracted under vacuum onto the chuck means 8. The turntable 6 is intermittently rotated through 120 degrees, whereby each of the chuck means 8 is successively positioned in a carry-in and carry-out zone 10, a rough grinding zone 12, and a precision grinding zone 14.

In the upright wall 5, there are disposed a rough grinding means, entirely indicated at the numeral 16, for rough-grinding the back of the wafer vacuum attracted to the chuck means 8 situated in the rough grinding zone 12, and a precision grinding means, entirely indicated at the numeral 18, for precision-grinding the back of the wafer vacuum attracted to the chuck means 8 situated in the precision grinding zone 14. The rough grinding means 16 is equipped with a rough grinding tool 20 rotated at a high speed, while the precision grinding means 18 is equipped with a precision grinding tool 22 rotated at a high speed.

A cassette carry-in zone 24, a wafer withdrawal zone 26, a transport means 28, and a wafer acceptance means 30 are disposed on the upper surface of a front half of the main portion 4 of the housing 2. Transfer means 32 and 34 are disposed on the upper surface of an intermediate portion of the main portion 4 of the housing 2. A semiconductor wafer treating apparatus, constituted in accordance with the present invention and indicated entirely at the numeral 36, is further disposed in the illustrated system. The semiconductor wafer treating apparatus 36 will be further described in detail later. A transport means 37 is disposed in relation to the wafer withdrawal zone 26.

Figure 2:
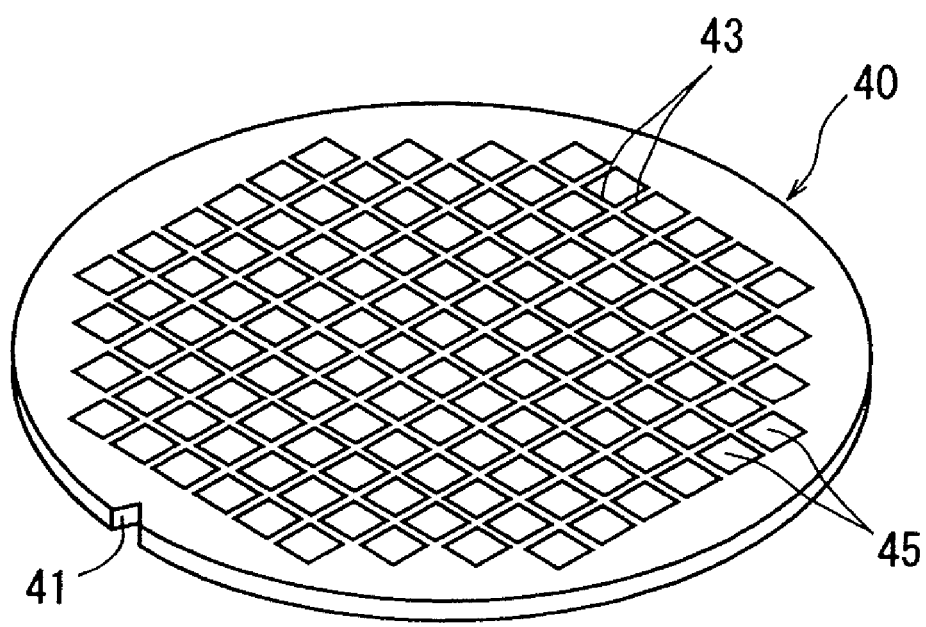
FIG. 2 is a perspective view showing a typical example of a semiconductor wafer treated by the system of FIG. 1.

A cassette 38 accommodating a plurality of semiconductor wafers is placed on the cassette carry-in zone 24. FIG. 2 shows a typical example of the semiconductor wafer. A wafer 40, which may be a silicon wafer, is nearly disk-shaped as a whole, and an orientation notch 41 is formed at its peripheral edge. On the face of the wafer 40, streets 43 are arranged in a lattice pattern, and many rectangular regions 45 are defined. A required semiconductor circuit is formed in each of the rectangular regions 45. If required, a protective tape (not shown) is stuck to the face of the wafer 40.

With further reference to FIG. 1, the transport means 28 withdraws the wafers 40, one by one, from the cassette 38 carried inward onto the cassette carry-in zone 24, and places the wafer 40, with its back pointed upward, on the wafer acceptance means 30. The transport means 32 carries the wafer 40 on the wafer acceptance means 30 inward onto the chuck means 8 located in the wafer carry-in and carry-out zone 10. The wafer 40 carried onto the chuck means 8, with its back pointed upward and exposed, is positioned in the rough grinding zone 12, together with the chuck means 8, upon 120-degree rotation of the turntable 6. In the rough grinding zone 12, the chuck means 8 is rotated, and the rough grinding tool 20 of the rough grinding means 16 is also rotated at a high speed and pressed against the back of the wafer 40 on the chuck means 8, whereby the back of the wafer 40 is roughly ground. Then, the turntable 6 is rotated through 120 degrees, whereupon the chuck means 8 vacuum attracting the wafer 40 having the back roughly ground is positioned in the precision grinding zone 14. In the precision grinding zone 14, the chuck means 8 is rotated, and the precision grinding tool 22 of the precision grinding means 18 is also rotated at a high speed and pressed against the back of the wafer 40 on the chuck means 8, whereby the back of the wafer 40 is precision-ground. Then, the turntable 6 is rotated through 120 degrees, whereupon the wafer 40 having the back precision-ground is positioned in the carry-in and carry-out zone 10. Then, the wafer 40 located in the carry-in and carry-out zone 10 is carried into the semiconductor wafer treating apparatus 36 by the transport means 34. In the semiconductor wafer treating apparatus 36, the ground back of the wafer 40 is cleaned and oxidized. Then, the wafer 40 having the back cleaned and oxidized is carried out of the semiconductor wafer treating apparatus 36 by the transport means 28, and placed on the wafer withdrawal zone 26. The wafer 40 placed on the wafer withdrawal zone 26 is transported by the transport means 37 to a tape sticking machine (not shown) for sticking a protective tape to the back of the wafer 40.

The features in the above-described system, which are other than those of the semiconductor wafer treating apparatus 36, may be substantially the same as the features of the system disclosed, for example, in U.S. Pat. No. 6,582,287. Thus, an explanation will be omitted herein for the features in the above-described system which are other than those of the semiconductor wafer treating apparatus 36.

Next, the semiconductor wafer treating apparatus 36 will be described in detail with reference to FIGS. 3-A, 3-B and FIGS. 4-A, 4-B along with FIG. 1. The semiconductor wafer treating apparatus 36 includes a housing 42. The housing 42 is defined by a part of an upper surface wall of the main portion 4 of the housing 2 stated earlier, a stationary member 44 fixed to the upper surface of the main portion 4, and a shutter member 46 mounted on the main portion 4 to be ascendable and descendable. The stationary member 44 has a rectangular side wall 48 extending substantially vertically and upwardly from the upper surface of the main portion 4, and a top wall 50 extending from the upper edge of the side wall 48 substantially horizontally and rightward in FIGS. 3-A and 3-B. The top wall 50 has a rectangular main portion and a trapezoidal leading end portion. The shutter member 46, in a plan view, extends along the peripheral edge of the top wall 50 of the stationary member 44. A suitable elevating means (not shown) is annexed to the shutter member 46, so that the shutter member 46 is raised and lowered between an opening position indicated by FIGS. 3-A and 4-A and a closing position indicated by FIGS. 3-B and 4-B. When the shutter member 46 is moved to the opening position, most of the side surface of the housing 42 (i.e., a portion which is other than the portion defined by the side wall 48 of the stationary member 44) is rendered open. When the shutter member 46 is moved to the closing position, the housing 42 is substantially closed.

A rotating means 52, which may be an electric motor, is disposed within the main portion 4 of the housing 2, and an output shaft 54 of the rotating means 52 penetrates the upper surface wall of the main portion 4 and protrudes into the housing 42. A holding means 56, which can be composed of a porous disk, is fixed to the upper end of the output shaft 54. The holding means 56 is selectively brought into communication with a vacuum source (not shown) via a communication passage (not shown) formed in the output shaft 54 to attract, under vacuum, the wafer 40 placed on the upper surface of the holding means 56.

A cleaning means 58 is disposed in the semiconductor wafer treating apparatus 36. In the illustrated embodiment, the cleaning means 58 includes a cleaning fluid jetting means 60 and a drying gas jetting means 62. The cleaning fluid jetting means 60 is composed of a jet pipe which penetrates the upper surface wall of the main portion 4 of the housing 2, protrudes into the housing 42, extends substantially vertically and upwardly in a corner portion of the housing 42, then extends substantially horizontally, and further extends downward. A nozzle (not shown) is disposed at a jetting end portion of the jet pipe. The drying gas jetting means 62 is similarly composed of a jet pipe which penetrates the upper surface wall of the main portion 4 of the housing 2, protrudes into the housing 42, extends substantially vertically and upwardly in the corner portion of the housing 42, then extends substantially horizontally, and further extends downward. A nozzle (not shown) is similarly disposed at a jetting end portion of the jet pipe. As understood from FIGS. 3-A, 3-B and FIGS. 4-A, 4-B, the drying gas jet pipe extends along the cleaning fluid jet pipe inwardly and downwardly of the cleaning fluid jet pipe. Moving means (not shown), which may be electromagnetic solenoids, are annexed to the cleaning fluid jetting means 60 and the drying gas jetting means 62, so that the cleaning fluid jetting means 60 and the drying gas jetting means 62 are selectively located at a non-operating position indicated by solid lines in FIGS. 3-B, 4-A and 4-B, and an operating position indicated by solid lines in FIG. 3-A and indicated by dashed double-dotted lines in FIG. 4-A. When the cleaning fluid jetting means 60 and the drying gas jetting means 62 are located at the operating position, their jetting end portions oppose a holding upper surface of the holding means 56 and stay above this holding upper surface. When the cleaning fluid jetting means 60 and the drying gas jetting means 62 are located at the non-operating position, their jetting end portions recede from the holding upper surface of the holding means 56 and stay in a side portion of the housing 42. A cleaning fluid, which may be pure water, is supplied, as appropriate, to the cleaning fluid jetting means 60. A drying gas, which may be hot air, is supplied, as appropriate, to the drying gas jetting means 62.

Further referring to FIGS. 3-A, 3-B and FIGS. 4-A, 4-B along with FIG. 1, an irradiation means 66 for irradiating the back of the wafer 40 with short wavelength ultraviolet radiation is disposed in the semiconductor wafer treating apparatus 36. In the illustrated embodiment, a housing 68 is disposed adjacent the main portion 4 of the housing 2, and a hydraulic slider 70 extending substantially horizontally is mounted on the upper surface of the housing 68. A support member 74 is fixed to the front end of a slide member 72 of the slider 70. The support member 74 has a main portion 76 extending horizontally, a closing portion 78 drooping substantially vertically from one end of the main portion 76, and a closing portion 80 drooping substantially vertically from the other end of the main portion 76. An irradiation unit 82 is mounted on the lower surface of the main portion 76 of the support member 74. The irradiation unit 82 includes a plurality of emission lamps (not shown) which emit short wavelength ultraviolet radiation having a wavelength of 150 to 300 nm. An irradiation unit sold under the trade name "Excimer VUV/O$_3$," by USHIO INC., Japan, can be named as the preferred irradiation unit. Such an irradiation unit includes a plurality of excimer lamps which throw short wavelength ultraviolet radiation having a wavelength of 172 nm. An irradiation unit including low pressure mercury lamps, which throw short wavelength ultraviolet radiation having a wavelength of 185 nm, can be used instead of the irradiation unit including the excimer lamps. An additional opening 84 of a shape corresponding to the shape of the closing portions 78 and 80 of the support member 74 is formed in the side wall 48 of the stationary member 44 defining the housing 42. When the slide member 72 of the slider 70 is expanded and contracted, the support member 74 and the irradiation unit 82 mounted thereon are moved through the additional opening 84. In the state shown in FIGS. 3-A and 4-A, the irradiation unit 82 is located at a non-operating position, and is positioned outside the housing 42. In this state, the closing portion 78 of the support member 74 rests in the additional opening 84 to close it substantially. In the state shown in FIGS. 3-B and 4-B, the irradiation unit 82 is located at an operating position, and opposes and stays above the holding upper surface of the holding means 56 within the housing 42. In this state, the closing portion 80 of the support member 74 rests in the additional opening 84 to close it substantially.

The actions of the above-described semiconductor wafer treating apparatus 36 will be described. As shown in FIGS. 3-A and 4-A, when the shutter member 46 is located at the opening position, the wafer 40 on the chuck means 8 positioned in the carry-in and carry-out zone 10 (namely, the wafer 40 having the back rough-ground and then precision-ground) is carried inward onto the holding means 56 of the semiconductor wafer treating apparatus 36 by the transport means 34. Then, the shutter member 46 is moved to the closing position shown in FIGS. 3-B and 4-B to close the housing 42. The wafer 40 placed on the holding means 56, with the back thereof pointed upward and exposed, is vacuum attracted to the upper surface of the holding means 56. The cleaning fluid jetting means 60 and the drying gas jetting means 62 constituting the cleaning means 58 are located at the operating position indicated by the solid lines in FIG. 3-A and indicated by the dashed double-dotted lines in FIG. 4-A. Then, the holding means 56 is rotated, and the cleaning fluid is jetted from the cleaning fluid jetting means 60 toward the back of the wafer 40, whereby the back of the wafer 40 is cleaned. Then, jetting of the cleaning fluid is stopped, and the drying gas is jetted from the drying gas jetting means 62 toward the back of the wafer 40, whereby the back of the wafer 40 is dried. Then, the rotation of the holding means 56 is stopped, and the cleaning fluid jetting means 60 and the drying gas jetting means 62 constituting the cleaning means 58 are moved to the non-operating position indicated by the solid lines in FIG. 3-B, 4-A and 4-B. Then, the support member 74 of the irradiation means 66, and the irradiation unit 82 mounted on the support member 74 are moved from the non-operating position shown in FIGS. 3-A and 4-A to the operating position shown in FIGS. 3-B and 4-B. Then, the rotation of the holding means 56 is resumed, and the irradiation unit 82 is energized. Thus, the back of the wafer 40 is irradiated with short wavelength ultraviolet radiation, whereby the back of the wafer 40 is oxidized to form an oxide film. Then, the rotation of the holding means 56 is stopped, and the irradiation unit 82 is deenergized. Then, the support member 74 and the irradiation unit 82 mounted thereon are moved to the non-operating position shown in FIGS. 3-A and 4-A, and the shutter member 46 is moved to the opening position shown in FIGS. 3-A and 4-A. Then, the wafer 40 on the holding means 56 is carried out onto the wafer withdrawal zone 26 by the transport means 28. Then, the next wafer 40 on the chuck means 8 positioned in the carry-in and carry-out zone 10 is carried inward onto the holding means 56 by the transport means 34.

As is well known, if the wafer 40 is a silicon wafer, irradiation of its back with short wavelength ultraviolet radiation results in the generation of active oxygen. If desired, a suitable exhaust means (not shown) can be annexed to the housing 42 and, after irradiation of the back of the wafer 40 with short wavelength ultraviolet radiation, the exhaust means can be energized to discharge active oxygen within the housing 42 to the outside of the housing 42.

While the preferred embodiments of the semiconductor wafer treating apparatus constituted in accordance with the present invention have been described in detail with reference to the accompanying drawings, it is to be understood that the present invention is not limited to such embodiments, but various changes and modifications may be made without departing from the scope of the present invention.

What I claim is:

1. An apparatus for grinding, cleaning, and oxidizing a back of a semiconductor wafer comprising: a grinding means, a wafer withdrawal zone, a transport means, a wafer acceptance means, a wafer treating section, and a main housing arranging each of the grinding means, the wafer withdrawal zone, the transport means, the wafer acceptance means, and the wafer treating section with said treating section being apart from the grinding means, said treating section comprising:

a local housing,
    holding means rotatably disposed within the local housing and having a holding upper surface,
    rotating means, within the local housing, for rotating the holding means,
    cleaning means, within the local housing, for cleaning a ground back surface of a semiconductor wafer held on the holding means with the ground back surface pointing upward,
    irradiation means for irradiating the ground and cleaned back surface of the semiconductor wafer held on the holding upper surface of the holding means, the irradiation means including an irradiation unit having radiation lamps for irradiating the wafer with short wavelength ultraviolet radiation so as to form an oxide film on the back surface by oxidization,
    a support member for mounting the irradiation means, and
    a moving means connected to the support member for transferring both the support member and the irradiation means between a non-operating position outside the local housing and an operating position, within the local housing, where the irradiation means is above and in opposition to the holding upper surface of the holding means.

2. The semiconductor wafer treating apparatus according to claim 1, wherein
    a part of the local housing is defined by a shutter member movable between a closing position and an opening position, when the shutter member is located at the closing position, the local housing is substantially closed, and when the shutter member is located at the opening position, an opening is formed in the local housing, and the semiconductor wafer can be carried into and carried out of the local housing through the opening.

3. The semiconductor wafer treating apparatus according to claim 1, wherein
    the holding means is mounted to be rotatable about a central axis extending substantially vertically,
    the cleaning means includes cleaning fluid jetting means and drying gas jetting means, and
    the cleaning fluid jetting means and the drying gas jetting means are selectively located at an operating position where a jetting end portion of each of the cleaning fluid jetting means and the drying gas jetting means opposes and stays above the holding upper surface of the holding means, and a non-operating position where the jetting end portion recedes from the holding upper surface of the holding means.

4. An apparatus for grinding, cleaning, and oxidizing a back of a semiconductor wafer comprising: a grinding means, a wafer withdrawal zone, a transport means, a wafer acceptance means, a wafer treating section, and a main housing arranging each of the grinding means, the wafer withdrawal zone, the transport means, the wafer acceptance means, and the wafer treating section with said treating section being apart from the grinding means, said treating section comprising:

a local housing, holding means rotatably disposed within the local housing and having a holding upper surface, rotating means, within the local housing, for rotating the holding means, cleaning means, within the local housing, for cleaning a ground back surface of a semiconductor wafer held on the holding means with the ground back surface pointing upward, irradiation means for irradiating the ground and cleaned back surface of the semiconductor wafer held on the holding upper surface of the holding means, the irradiation means including an irradiation unit having radiation lamps for irradiating the wafer with short wavelength ultraviolet radiation so as to form an oxide film on the back surface by oxidization, a support member for mounting the irradiation means, and a moving means connected to the support member for transferring both the support member and the irradiation means between a non-operating position outside the local housing and an operating position, within the local housing, where the irradiation means is above and in opposition to the holding upper surface of the holding means, wherein the support member and the irradiation unit mounted on the support member are moveable horizontally through an opening formed in a wall of the local housing, whereby the irradiation unit is selectively located at the operating position and the non-operating position, and the support member has a first closing portion for substantially closing the opening when the irradiation unit is located at the operating position, and a second closing portion for substantially closing the opening when the irradiation unit is located at the non-operating position.

5. The semiconductor wafer treating apparatus according to claim 4, wherein a part of the local housing is defined by a shutter member movable between a closing position and an opening position, when the shutter member is located at the closing position, the local housing is substantially closed, and when the shutter member is located at the opening position, an opening is formed in the local housing, and the semiconductor wafer can be carried into and carried out of the local housing through the opening.

6. The semiconductor wafer treating apparatus according to claim 4, wherein the holding means is mounted to be rotatable about a central axis extending substantially vertically, the cleaning means includes cleaning fluid jetting means and drying gas jetting means, and the cleaning fluid jetting means and the drying gas jetting means are selectively located at an operating position where a jetting end portion of each of the cleaning fluid jetting means and the drying gas jetting means opposes and stays above the holding upper surface of the holding means, and a non-operating position where the jetting end portion recedes from the holding upper surface of the holding means.

* * * * *